United States Patent
Seo et al.

(10) Patent No.: US 7,611,273 B2
(45) Date of Patent: Nov. 3, 2009

(54) POINT LIGHT SOURCE, LIGHT-EMITTING MODULE AND DISPLAY DEVICE HAVING THE SAME

(75) Inventors: Jeong-Min Seo, Gyeonggi-do (KR);
Byung-Woong Han, Incheon (KR);
Kyu-Seok Kim, Yongin-si (KR);
Jeung-Soo Kim, Seoul (KR);
Young-Hee Park, Busan (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 134 days.

(21) Appl. No.: 11/564,683

(22) Filed: Nov. 29, 2006

(65) Prior Publication Data

US 2007/0195524 A1  Aug. 23, 2007

(30) Foreign Application Priority Data

Feb. 21, 2006 (KR) .................... 10-2006-0016530

(51) Int. Cl.
*F21V 7/04* (2006.01)
(52) U.S. Cl. ............... 362/612; 362/555; 362/601; 362/606; 362/608; 362/615
(58) Field of Classification Search ............ 362/230, 362/231, 260, 293, 555, 600, 601, 606, 608, 362/610, 612–615, 631; 313/502, 512; 257/100
See application file for complete search history.

(56) References Cited

U.S. PATENT DOCUMENTS

| | | | |
|---|---|---|---|
| 7,278,756 B2 * | 10/2007 | Leu et al. | 362/260 |
| 2006/0072339 A1 * | 4/2006 | Li et al. | 362/608 |
| 2006/0268555 A1 * | 11/2006 | Kelly | 362/341 |

FOREIGN PATENT DOCUMENTS

JP  2004-212830  7/2004

OTHER PUBLICATIONS

English Abstract for Publication No. 2004-212830.

\* cited by examiner

*Primary Examiner*—Sandra L O'Shea
*Assistant Examiner*—Meghan K Dunwiddie
(74) *Attorney, Agent, or Firm*—F. Chau & Associates, LLC

(57) ABSTRACT

A point light source includes a body, a light-emitting unit and a fluorescent unit. The body includes a bottom portion and a protrusion portion protruded from the bottom portion. The light-emitting unit includes a light-emitting chip disposed at the protrusion to have an inclined-angle with respect to the bottom portion. The fluorescent unit covers the bottom portion, the protrusion portion and the light-emitting chip. The point light source has an emitting-angle of about 180 degrees and luminance difference between a bright-portion and a dark-portion is decreased to enhance display quality of a display device.

18 Claims, 7 Drawing Sheets

POINT LIGHT SOURCE, LIGHT-EMITTING MODULE AND DISPLAY DEVICE HAVING THE SAME

CROSS-REFERENCE TO RELATED APPLICATIONS

This application claims priority to Korean Patent Application No. 2006-16530 filed on Feb. 21, 2006, the contents of which are herein incorporated by reference in their entirety.

BACKGROUND OF THE INVENTION

1. Field of the Invention

Embodiments of the present invention relate to a point light source, a light-emitting module having the point light source and a display device having the point light source. More particularly, embodiments of the present invention relate to a point light source, capable of having wide viewing-angle, a light-emitting module having the point light source and a display device having the point light source 2. Description of the Related Art In general, a liquid crystal display (LCD) apparatus includes a backlight assembly in order to display an image in a dark place. A small or medium-sized LCD apparatus employed by a mobile device, such as a cellular phone or a personal digital assistant (PDA), includes a light-emitting diode which has low power consumption, small volume and light weight.

Recently, brightness of the light-emitting module and the LCD apparatus have been improved to some extent by a light-emitting diode emitting high luminance of light. However, because of an optical characteristic of the light-emitting diode, a bright-portion and a dark-portion may occur at a display screen adjacent to the light-emitting diode. Thus, a display quality of the LCD apparatus is deteriorated.

In order to improve the display quality, a light-diffusing pattern is formed at a side surface of a light-guiding plate, where the light-emitting diode is disposed, to uniformize luminance throughout the display screen.

In order to reduce the number of light-emitting diodes for manufacturing cost reduction, light-emitting diodes generating high luminance light have been developed. However, when the number of the light-emitting diodes is reduced, a distance between the light-emitting diodes increases, lowering the luminance uniformity. Furthermore, as an LCD apparatus decreases in size and a low temperature poly-silicon of the LCD apparatus is developed, a gap between the light-emitting diode and an effective display area is decreased. Thus it is desired to uniformize the bright-portion and the dark-portion adjacent to a light-incident portion of the light-guiding plate.

Furthermore, a gap between the light-emitting diode and the light-incident portion of the light-guiding plate may become greater than the designed value due to manufacturing error margins of parts of the backlight assembly. Therefore, a portion of light generated by the light-emitting diode is not guided by the light-guiding unit and is lost, so that power consumption of the backlight assembly and a display apparatus having the backlight assembly increases.

SUMMARY OF THE INVENTION

Embodiments of the present invention provide a point light source capable of having an emitting-angle of about 180 degrees and decreasing a bright-portion and a dark-portion.

Embodiments of the present invention provide a light-emitting module having the point light source.

Embodiments of the present invention provide a display device having the point light source.

In an exemplary point light source according to an embodiment of the present invention, the point light source includes a body, a light-emitting unit and a fluorescent unit. The body includes a bottom portion and a protrusion portion protruded from the bottom portion. The light-emitting unit includes a light-emitting chip disposed at the protrusion with respect to the bottom portion by an inclined-angle. The fluorescent unit covers the bottom portion, the protrusion portion and the light-emitting chip.

According to an embodiment of the invention, the protrusion portion includes a first inclined-surface, a second inclined-surface and an upper surface. The first inclined-surface is inclined with respect to a surface of the bottom portion by a first angle. The first and second inclined-surfaces are substantially symmetric with respect to a perpendicular surface to the surface of the bottom portion. The upper surface connects a top portion of the first inclined-surface to a top portion of the second inclined-surface. The light-emitting unit includes a first light-emitting chip disposed at the first inclined-surface and a second light-emitting chip disposed at the second inclined-surface. A surface of the fluorescent unit includes a first surface corresponding to the first inclined-surface, a second surface corresponding to the second inclined-surface and a third surface corresponding to the upper surface. The first and second light-emitting chips emit a blue-colored light, the fluorescent unit receives the blue-colored light, and the fluorescent unit includes a yellow fluorescent unit receiving the blue-colored light and emitting a white-colored light. The first angle has a range of about 30 degrees to about 45 degrees.

In another exemplary point light source according to an embodiment of the present invention, a surface of the protrusion portion includes a round curved-surface. The surface of the light-emitting unit corresponds to the surface of the protrusion portion and includes the round curved-surface.

In an exemplary light emitting module according to an embodiment of the present invention, the light emitting module includes a light-guiding unit including a groove, a point light source and a power supply substrate. The point light source disposed at the groove that includes a light-emitting chip emitting a first light, and a fluorescent unit receiving the first light and emitting a second light to the light-guiding unit. The power supply substrate on which the point source is mounted, provides a driving current to the light-emitting chip. The point light source includes a body and a light-emitting unit. The body includes a bottom portion and a protrusion portion, The bottom portion is disposed at the groove and the protrusion portion is protruded from the bottom portion to the groove. The light-emitting unit includes light-emitting chips. The light-emitting chips are disposed at the protrusion portion to be inclined with respect to the bottom portion by an inclined-angle. The fluorescent unit covers the bottom portion, the protrusion and the light-emitting chips. According to an embodiment of the invention, the light-guiding unit includes a light-emitting surface, an opposite surface and a side surface. The light-emitting surface emits the second light and the opposite surface disposed opposite to the light-emitting surface. The groove is formed at a side surface. The light-emitting module includes a plurality of grooves, the grooves are formed at the side surface, and the point light source is disposed at the grooves, respectively. The protrusion portion includes a first inclined-surface and a second inclined-surface. A first light-emitting unit is disposed at the first inclined-surface and the first inclined-surface is inclined with respect to a surface of the bottom portion by a first angle. A second light-emitting unit is disposed at the second inclined-surface. The first and second inclined-surfaces are substantially symmetric with respect to a perpendicular surface to the surface of the bottom portion. The groove includes a first inner side surface and a second inner side surface. The first inner side surface corresponds to the first inclined-surface and the second inner side surface corresponds to the second inclined-surface.

In an exemplary display device according to an embodiment of the present invention, the display device includes a point light source, a power supply substrate, a light-guiding unit and a display panel. The point light source includes a body, a light-emitting unit and a fluorescent unit. The body includes a bottom surface, a first inclined-surface and a second inclined-surface. The first inclined-surface is inclined with respect to the bottom surface by a first angle. The first and second inclined-surfaces are substantially symmetric with respect to a perpendicular surface to the bottom surface. The light-emitting unit includes a first light-emitting chip and a second light-emitting chip. The first light-emitting chip is disposed at the first inclined-surface and the second light-emitting chip is disposed at the second inclined-surface. The fluorescent unit covers the bottom surface, the first inclined-surface, the second inclined-surface, the first light-emitting chip and the second light-emitting chip. The point light source is disposed at a power supply substrate. The power supply substrate provides a driving current to the first and second light-emitting chips. The light-guiding unit includes a light-emitting surface, an opposite surface and a side surface. The opposite surface is disposed opposite to the light-emitting surface. The groove, in which the point light source is disposed, is formed at a side surface. The display panel displays an image by using a light emitted from the light-emitting surface.

According to an embodiment of the invention, the light-emitting surface includes an effective emitting area corresponding to an effective display area of the display panel. A first extended-surface is extended from the first inclined-surface and a second extended-surface is extended from the second inclined-surface. The first and second extended-surfaces cross each other at an outer portion of the effective emitting area.

According to an embodiment of the present invention, the luminance difference between the bright-portion and the dark-portion at the display screen is decreased and a display quality is improved.

DESCRIPTION OF THE EXEMPLARY EMBODIMENTS

It should be understood that the exemplary embodiments of the present invention described below may be varied modified in many different ways without departing from the inventive principles disclosed herein, and the scope of the present invention is therefore not limited to these particular flowing embodiments. Rather, these embodiments are provided so that this disclosure will be thorough and complete, and will fully convey the concept of the invention to those skilled in the art by way of example and not of limitation. Hereinafter, the embodiments of the present invention will be described in detail with reference to the accompanied drawings.

Point Light Source

Figure 1:
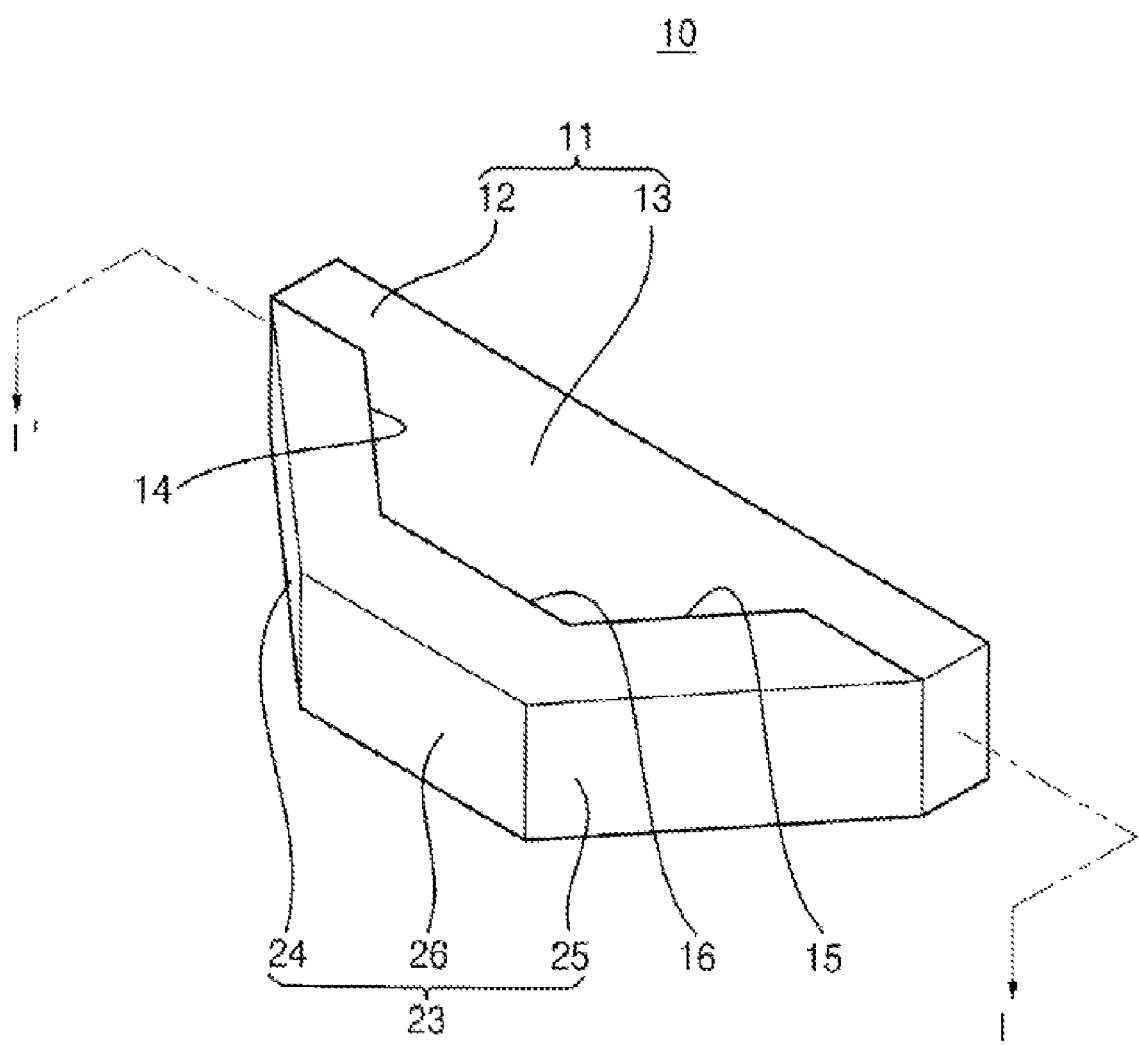
FIG. 1 is a perspective view illustrating a point light source in accordance with an example embodiment of the present invention.
Figure 2:
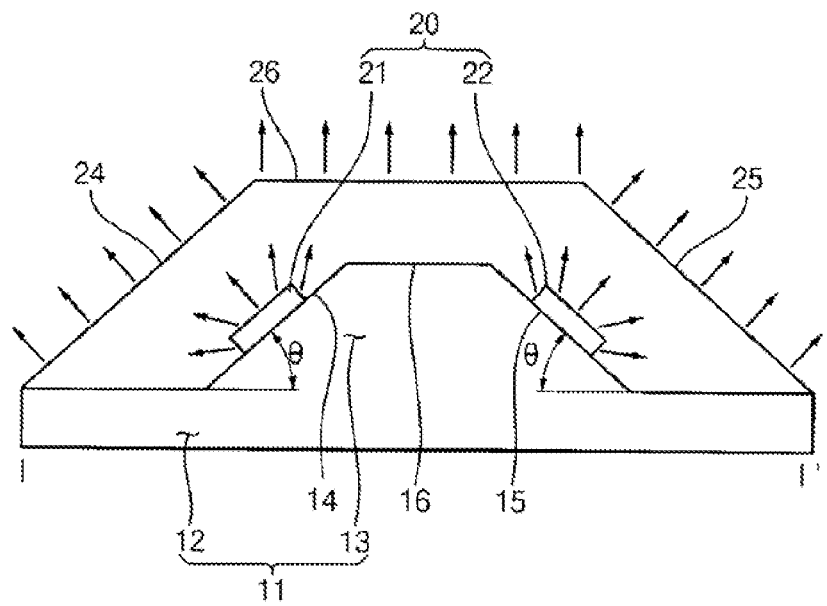
FIG. 2 is a cross-sectional view illustrating the point light source taken along a line I-I' in FIG. 1.

FIG. 1 is a perspective view illustrating a point light source in accordance with an example embodiment of the present invention, and FIG. 2 is a cross-sectional view illustrating the point light source taken along a line I-I' in FIG. 1.

Referring to FIG. 1, the point light source 10 includes a body 11, a light-emitting unit 20 and a fluorescent unit 23.

The body 11 may include an electrically insulating resin. The body 11 supports the light-emitting unit 20 and the fluorescent unit 23. The body 11 includes a bottom portion 12 and a protrusion portion 13.

The bottom portion 12 may have a plate shape. The protrusion portion 13 is protruded from a middle portion of the bottom portion 12. The protrusion portion 13 may be extended in one direction and may have a cone-shape.

For example, the protrusion portion 13 includes a first inclined-surface 14, a second inclined-surface 15 and an upper surface 16.

The first inclined-surface 14 is protruded from a surface of the bottom portion 12. The first inclined-surface 14 is inclined by a first angle θ, which corresponds to an acute angle, with respect to the surface of the bottom surface 12. The second inclined-surface 15 and the first inclined-surface 14 are in substantially symmetric with respect to a surface that is substantially perpendicular to the surface of the bottom surface 12. The upper surface 16 connects a top portion of the first inclined-surface 14 with a top portion of the second inclined-surface 15. Therefore, when viewed on a cross-section of the protrusion portion 13, a distance from a lower-end portion of the first inclined-surface 14 to a lower-end portion of the second inclined-surface 15 is larger than a distance from a top portion of the first inclined-surface 14 to a top portion of the second inclined-surface 15. Thus, the section of the protrusion portion 13 may have a substantially trapezoidal shape.

The light-emitting unit 20 is disposed at the protrusion portion 13 and emits light. The light-emitting unit 20 is disposed inclined with respect to the surface of the bottom surface 12. The light-emitting unit 20 includes a first light-emitting chip 21 and a second light-emitting chip 22. The first light-emitting chip 21 is disposed at the first inclined-surface 14 and the second light-emitting chip 22 is disposed at the second inclined-surface 15. Alternately, the light-emitting unit 20 may further include a third light-emitting chip disposed at the upper surface 16.

The first and second light-emitting chips 21 and 22 include a power-providing terminal, respectively. For example, an anode terminal is connected to a surface of the first light-emitting chip 21 and a cathode terminal is connected to another surface thereof. When driving current is provided at the anode and cathode terminal, the first light-emitting chip 21 emits light.

The first and second light-emitting chips 21 and 22 may include a P-N junction semiconductor. For example, the first and second light-emitting chips 21 and 22 may include gallium arsenide (GaAs), gallium phosphorus (GaP), gallium-arsenic-phosphorus ($Gas_{1-x}P_x$), gallium-aluminum-arsenic ($Ga_{1-x}Al_xAs$), indium phosphorus (InP) and indium-gallium-phosphorus ($In_{1-x}Ga_xP$).

The first and second light-emitting chips 21 and 22 convert electrical energy into light. A wavelength of the light emitted from the first and second light-emitting chips 21 and 22 may be different according to a kind of impurity added to the semiconductor. For example, the first and second light-emitting chips 21 and 22 include gallium nitride (GaN) to emit a blue-colored light. Alternately, the first and second light-emitting chips 21 and 22 may include gallium phosphorus (GaP). Then, an emitted-light under an atmosphere of a zinc-atom and an oxygen-atom may become a red-colored light of which the wavelength is 700 nm and an emitted-light under an atmosphere of a nitrogen-atom may become a green-colored light of which the wavelength is 550 nm.

The fluorescent unit 23 receives the light emitted from the first and second light-emitting chips 21 and 22, and emits a light having a different wavelength from that of the received-light. The fluorescent unit 23 covers the surface of the bottom portion 12, the first inclined-surface 14, the second inclined-surface 15, the upper surface 16, the first light-emitting chip 21 and the second light-emitting chip 22.

A surface of the fluorescent unit 23 includes a first surface 24, a second surface 25 and a third surface 26. The first surface 24 corresponds to the first inclined-surface 14, the second surface 25 corresponds to the second inclined-surface 25 and the third surface 26 corresponds to the third inclined-surface 26. The surface of the fluorescent unit 23 may have a shape corresponding to the surface of the protrusion portion 13. Alternately, the fluorescent unit 23 may have a round-shape, for example, a half-circular shape. The fluorescent unit 23 may be formed at the body 11.

Alternately, the point light source may further include a protecting layer covering the surface of the fluorescent unit 23.

In this exemplary embodiment, the fluorescent unit 23 includes a yellow fluorescent unit 23, for example $Y_3Al_5O_{12}$ (YAG) fluorescent unit 23. The yellow fluorescent unit 23 receives a white-colored light from outside and emits a yellow-colored light. When the yellow fluorescent unit 23 receives a blue-colored light from outside, the yellow fluorescent unit 23 emits a white-colored light.

In this exemplary embodiment, the first and second light-emitting chips 21 and 22 emit the blue-colored light, and the fluorescent unit 23 receives the blue-colored light and emits the white-colored light.

In another exemplary embodiment, the fluorescent unit 23 may include a red fluorescent unit material and a green fluorescent unit material. For example, the red and green fluorescent unit materials are mixed in a predetermined rate to form the fluorescent unit 23 to emit white-colored light, when the fluorescent unit 23 receives the blue-colored light.

In still another exemplary embodiment, a color characteristic of the in fluorescent unit 23 may be variously changed according to the wavelength range of the light requested from the light-emitting module 5.

Referring to FIG. 2, the light from the first and second light-emitting chips 21 and 22 are emitted in a fan-shaped direction. Also, the light generated from the fluorescent unit 23 progresses in a fan-shaped direction. Therefore, the light generated from the fluorescent unit 23 is reflected at the surface of the bottom portion 12, the first and second inclined-surfaces 14 and 15, and the upper surface 16. Then the white-colored light is uniformly emitted from the surfaces of the fluorescent unit 23, which are the first to third surfaces 24 to 26. Also, since the bottom portion 12 has a plate shape, the point light source has an emitting-angle of about 180 degrees.

The luminance of the light emitted from the first to third surfaces 24 to 26 is affected by the shape of the protrusion portion 13. For example, the luminance of the light is affected by the first angle $\theta$ that the first inclined-surface 14 is inclined with respect to the surface of the bottom portion 12. When the first angle $\theta$ is increased, the amount of light emitted to the first and second surfaces 24 and 25 increases and the amount of light emitted to the third surface 26 decreases. On the other hand, when the first angle $\theta$ is decreased, the amount of light emitted to the third surface 26 increases, but the amount of light being emitted to the first and second surfaces 24 and 25 decreases. In order for the amount of light emitted to the first surfaces the second surface and the third surface 24, 25 and 26 to become uniform, the first angle $\theta$ may be in a range of about 30 degrees to about 45 degrees.

Figure 3:
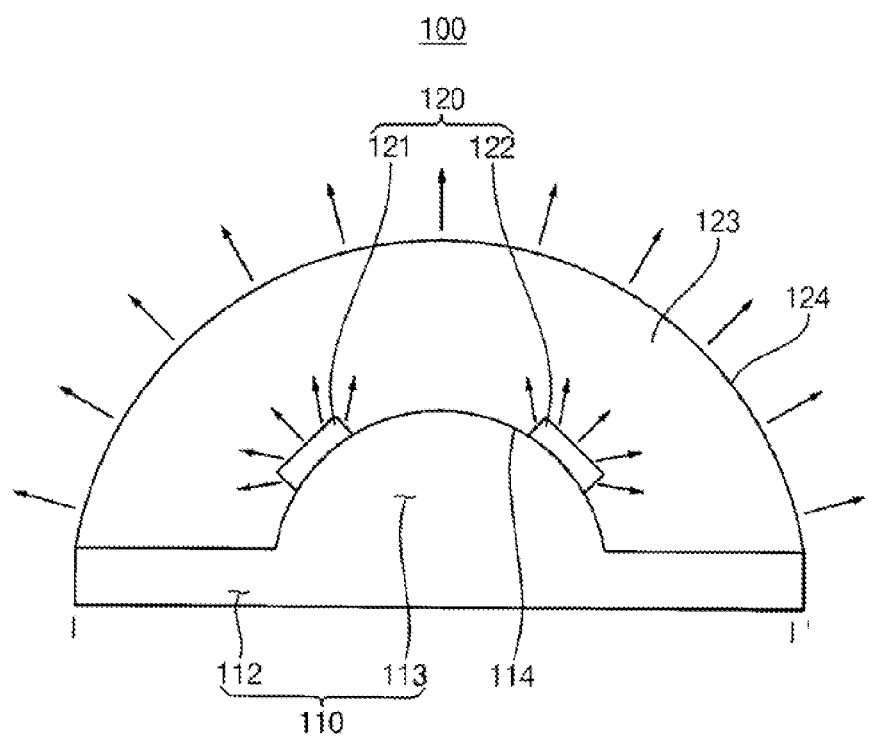
FIG. 3 is a cross-sectional view illustrating a point light source in accordance with another example embodiment of the present invention.

FIG. 3 is a cross-sectional view illustrating a point light source in accordance with another example embodiment of the present invention.

Referring to FIG. 3, the point light source 100 includes a body 110, a light emitting unit 120 and a fluorescent unit 123. The point light source 100 is substantially the same as the point light source 10 in FIGS. 1 and 2 except for a shape of the body 110 and the fluorescent unit 123.

The body 110 includes a bottom portion 112 and a protrusion portion 113. The bottom portion 112 may have a plate shape. The protrusion portion 113 is protruded from a middle of the bottom portion 112. A surface of the protrusion portion 113 may include a round curved-surface. For example, the protrusion portion 113 may have a half-circular shape.

The light-emitting unit 120 includes a first light-emitting chip 121 and a second light-emitting chip 122. The first and second light-emitting chips 121 and 122 are disposed at the surface of the protrusion portion 113. The first and second light-emitting chips 121 and 122 are disposed as in a same height from a surface of the bottom portion 112. Since the protrusion portion 113 has the half-circular shape, the first and second light-emitting chips 121 and 122 are inclined with respect to the surface of the bottom portion 112.

The fluorescent unit 123 is formed to cover the surface of the bottom portion 112, the surface of the protrusion portion 113, and the first and second light-emitting chips 121 and 122.

Light-Emitting Module

Figure 4:
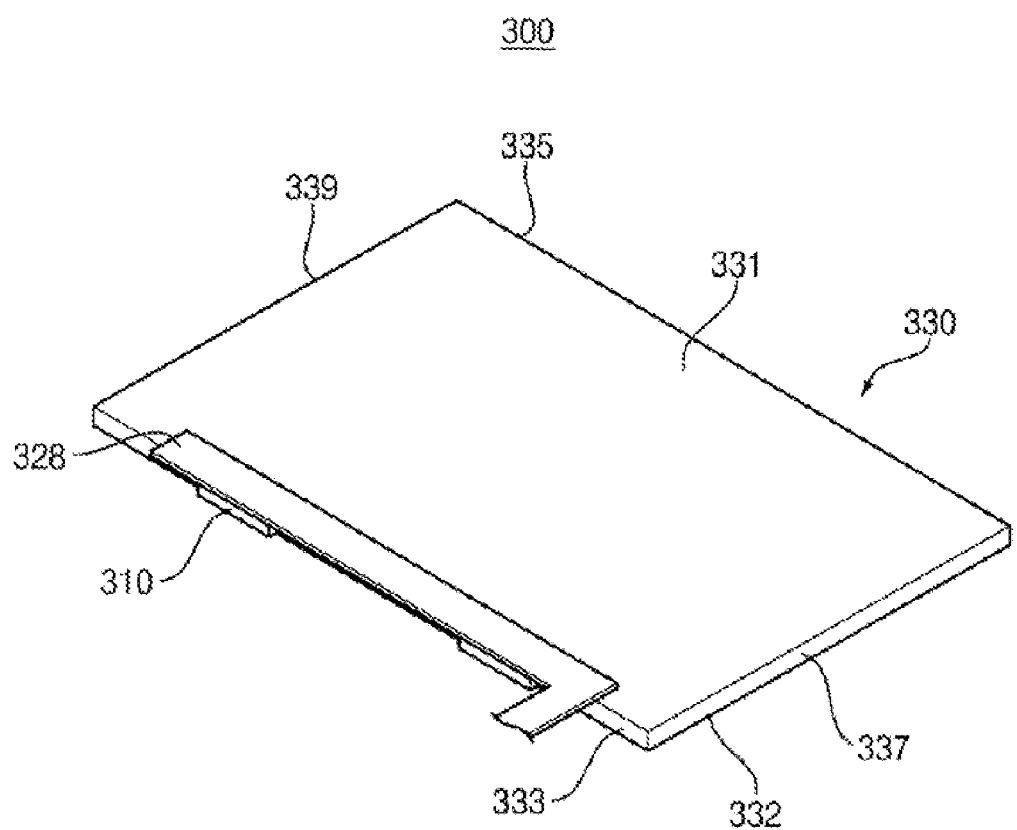
FIG. 4 is a perspective view illustrating a light-emitting module in accordance with an example embodiment of the present invention.
Figure 5:
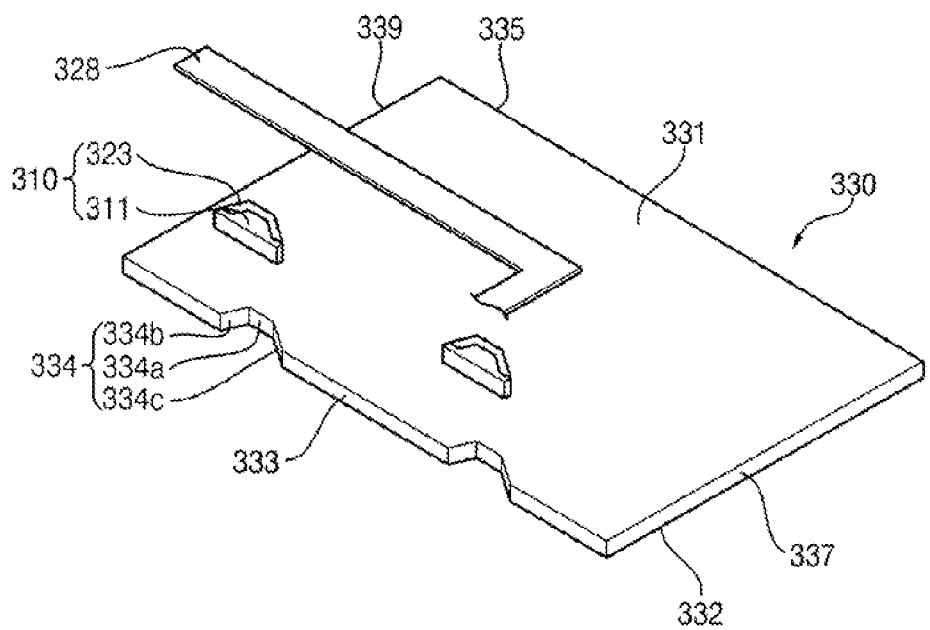
FIG. 5 is an exploded perspective view illustrating the light-emitting module in FIG. 4.

FIG. 4 is a perspective view illustrating a light-emitting module in accordance with an example embodiment of the present invention, and FIG. 5 is an exploded perspective view illustrating the light-emitting module in FIG. 4.

Referring to FIGS. 4 and 5, the light-emitting module 300 includes a point light source 310, a light-guiding unit 330 and a power supply substrate 328.

The point light source 310 includes a body 311, a light-emitting unit and a fluorescent unit 323. The point light source 310 is substantially the same as the point light source 10 in FIGS. 1 and 2. The light-emitting module 300 as shown includes two point light sources 310. This number is exemplary, and light-emitting modules according to other embodiments of the invention can have more or fewer point light sources.

The light-guiding unit 330 guides and emits a light that is emitted from first and second light-emitting chips and passes through the fluorescent unit 323. The light-guiding unit 330 may preferably include a light-scattering and light-guiding material that has a light transmittance, a thermal resistance, a chemical resistance and a high strength. For example, the light-scattering and light-guiding material may include polymethyl methacrylate, polyamide, polyimide, polypropylene and polyurethane, etc.

The light-guiding unit 330 may have a plate shape. The light-guiding unit 330 includes a light-emitting surface 331, an opposite surface 332 and a first side surface 333, a second side surface 335, a third side surface 337 and a fourth side surface 339. Alternately, the light-guiding unit 330 may have a wedge-shape having a decreasing thickness along a direction from one of the first, second, third and fourth side surfaces 333, 335, 337 and 339.

The light-emitting surface 331 and the opposite surface 332 are disposed opposite to each other, The first, second, third and fourth side surface 333, 335, 337 and 339 connect the light-emitting surface 331 to the opposite surface 332. The first and second side surfaces 333 and 335 are disposed opposite to each other. The third and fourth side surfaces 337 and 339 are disposed opposite to each other and connect the first side surface 333 to the second side surface 335.

The light-guiding unit 330 includes a groove 334. The groove 334 provides a receiving space of the point light source. A position of the groove 334 may be variously changed at the light-emitting surface 331, the opposite surface 332 and the first, second, third and fourth side surfaces 333, 335, 337 and 339. A number of the grooves 334 may also be variously changed according to an emitted light-intensity desired at the light-emitting module 300. In this exemplary embodiment, referred to FIG. 5, two grooves 334 are formed at the first side surface 333 and the point light sources 310 are respectively disposed at the grooves 334.

For example, the groove 334 is formed to be opened in a direction of the light-emitting surface 331 and the opposite surface 332. The groove 334 includes a bottom surface 334a, a first inner side surface 334b and a second inner side surface 334c. The bottom surface 334a is substantially parallel with the first side surface 333. The bottom surface 334a is formed in a predetermined depth from the first side surface 333 to receive the point light source 310. The first and second inner side surfaces 334b and 334c connect in the bottom surface 334a to the first side surface 333, respectively. The first inner side surface 334b corresponds to a first inclined-surface of the protrusion portion and a first surface of the fluorescent unit 323. The second inner side surface 334c corresponds to a second inclined-surface of the protrusion portion and a second surface of the fluorescent unit 323. The bottom surface 334a corresponds to an upper surface of the protrusion portion and a third surface of the fluorescent unit 323.

A shape of the groove 334 may be variously changed according to a shape of the fluorescent unit 323. For example, referring to FIG. 3, when a surface of the fluorescent unit 323 has a round-shape, the groove 334 may have a round-shape corresponding to the surface of the fluorescent unit 323.

The power supply substrate 328 includes a base film, an insulating layer and an electrical pattern. The base film may include an insulating resin and has a flexible characteristic. The electrical pattern is formed on the base film. The insulating layer covers the electrical pattern and electrically insulates the electrical pattern from outside.

The point light source 310 mounted on the insulating layer of the power supply substrate 328 is inserted into the groove 334. A power supply terminal drawn from the first and second light-emitting chips is electrically connected with the electrical pattern. The power supply substrate 328 provides a driving current provided from the external device to the first and second light-emitting chips.

Figure 6:
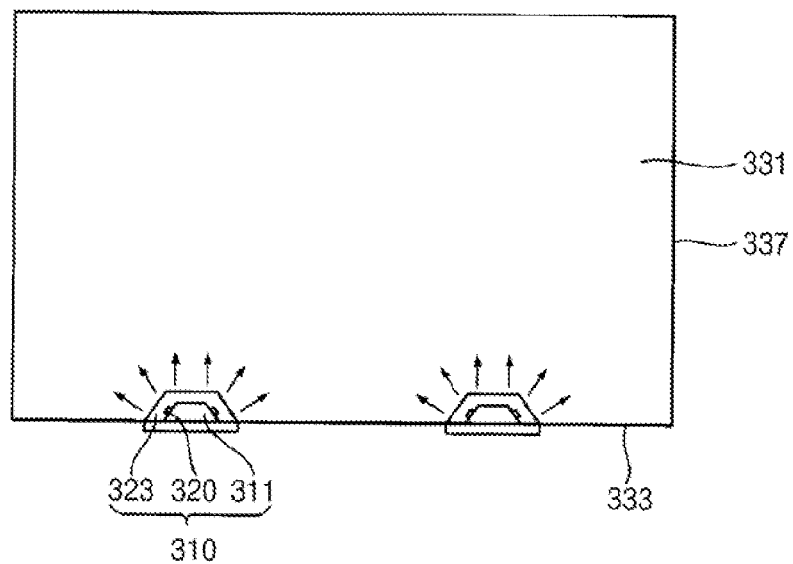
FIG. 6 is a plan view illustrating the light-emitting module in FIG. 5.

FIG. 6 is a plan view illustrating the light-emitting module in FIG. 5.

Referring to FIGS. 5 and 6, since the point light source 310 is inserted into the groove 334, a width of the light-emitting module is smaller than a width of a light-emitting module having the point light source 310 which is disposed at the first side surface 333 thereof. Also, since the surface of the fluorescent unit 323 corresponds to the shape of the groove 334, loss of light emitted from the fluorescent unit 323 is reduced.

Also, the point light source has an emitting-angle of about 180 degrees and the luminance of light emitted from the first to third surfaces of the fluorescent unit 323 is uniform. Thus, a luminance difference between the bright-portion and the dark-portion occurred partially at a peripheral portion of the point light source 310 is significantly reduced.

Display Device

Figure 7:
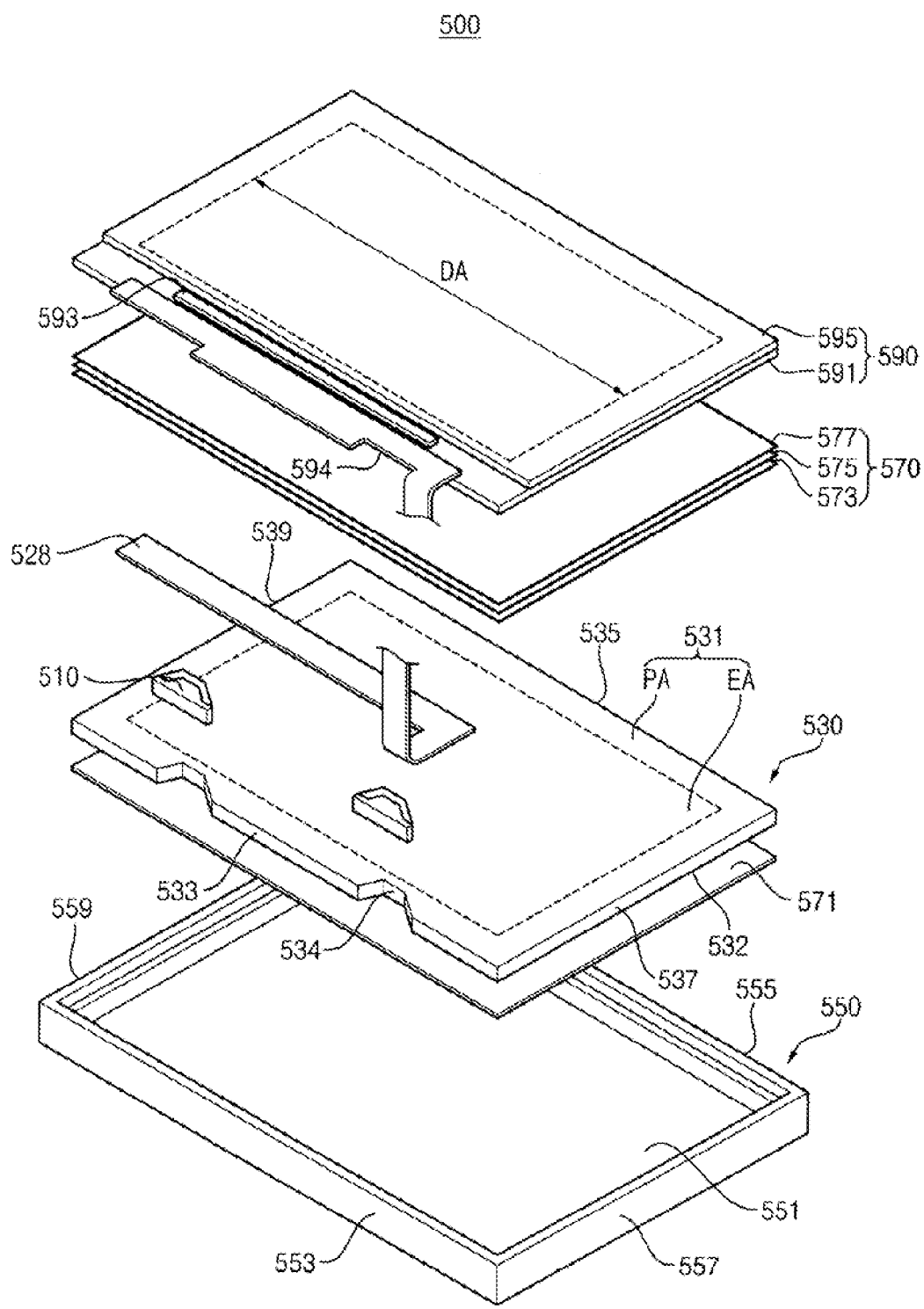
FIG. 7 is a perspective view illustrating a display device in accordance with an example embodiment of the present invention.
Figure 8:
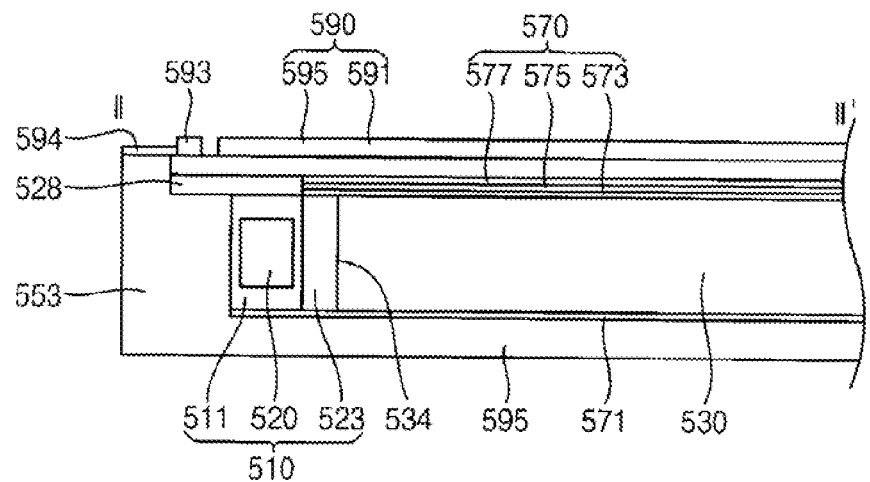
FIG. 8 is a cross-sectional view illustrating the display device taken along a line II-II' in FIG. 7.

FIG. 7 is a perspective view illustrating a display device in accordance with an example embodiment of the present invention, and FIG. 8 is a cross-sectional view illustrating the display device taken along a line II-II' in FIG. 7.

Referring to FIGS. 7 and 8, the display device 500 includes a point light source 510, a power supply substrate 528, a light-guiding unit 530 and a display panel 590.

The point light source 510, the power supply substrate 528 and the light-guiding unit 530 are substantially the same as the point light source 310, the in power supply substrate 328 and the light-guiding unit 330, respectively in FIGS. 4 to 6.

A light-emitting surface 531 of the light-guiding unit 530 includes an effective emitting area EA and a peripheral area PA surrounding the effective emitting area EA. The effective emitting area EA corresponds to an effective display area DA of the display panel 590, which will be described below. The groove 534 is formed at the first side surface 533 of the light-guiding unit 530. The groove 534 is formed in a predetermined depth such that a bottom surface of the groove 534 is disposed at the peripheral area PA.

The display device 500 may further include a receiving container 550 and an optical sheet 570.

The receiving container 550 receives the point light source 510 mounted on the power supply substrate 528 and inserted into the groove 534, the light-guiding unit 530, the optical sheet 570 and the display panel 590. The receiving container 550 includes a bottom plate 551, a first side wall 553, a second side wall 555, a third side wall 557 and a fourth side wail 559.

The light-guiding unit 530 having a plate shape is disposed on the bottom plate 551 of the receiving container 550. The opening portion is formed at a middle portion of the bottom plate 551 to reduce a weight of the receiving container 550. The first, second, third and fourth side walls 553, 55, 557 and 559 are disposed at a peripheral portion of the bottom plate 531 corresponding to the first, second, third and fourth side surfaces 533, 535, 537 and 539 of the light-guiding unit 530, respectively. A stepped portion is formed at an inner portion of the first, second, third and fourth side walls 553, 555, 557 and 559. Thus, an external portion of the first, second, third and fourth side walls 553, 555, 557 and 559 may be higher than the inner portion thereof by the stepped portion.

The optical sheet 570 is disposed over the light-guiding unit 530. The optical sheet 570 improves optical characteristics, for example, luminance and luminance uniformity of a white-colored light emitted from the light-guiding unit 530 and emits the white-colored light to the display panel 590. The optical sheet 570 may include, for example, a reflective sheet 571, a diffusion sheet 573 and prism sheets 575 and 577.

The reflective sheet 571 faces the opposite surface 532 of the light-guiding unit 530. The reflective sheet 571 reflects the white-colored light, which is leaked from the opposite surface 532, back to the opposite surface 532.

The diffusion sheet 573 is disposed on the light-emitting surface 531. The diffusion sheet 573 improves the luminance uniformity of the white-colored light emitted from the light-guiding unit 530. The prism sheets 575 and 577 are disposed on the diffusion sheet 573. The prism sheets 575 and 577 improve the front-view luminance of the white-colored light emitted from the diffusion sheet 573.

The display panel 590 receives light passing through the optical sheet 570 and displays images by using the light. The display panel 590 is disposed at the stepped portion formed at the first, second, third and fourth side walls 553, 555, 557 and 559. The display panel 590 includes a first substrate 591, a second substrate 595 and a liquid crystal layer (not shown).

The first substrate 591 includes a plurality of pixel portions and a plurality of switching elements. The pixel portions are arranged in a matrix shape. The switching elements provide a data voltage to the pixel portions, respectively. The second substrate 595 faces the first substrate 591 and is spaced apart from the first substrate 591 by a pre-determined distance. The second substrate 595 includes a color filter portion corresponding to the pixel portions, and a common electrode. The second substrate 595 is a substrate for displaying color. The second substrate 595 includes an effective display area DA and a peripheral area surrounding the effective display area DA. The effective display area DA corresponds to an effective emitting area EA of the light-guiding unit 530.

The liquid crystal layer is disposed between the first and second substrates 591 and 595. An arrangement of liquid crystal molecules of the liquid crystal layer is changed in response to an electric field generated between the pixel portions and the common electrode. Thus, a light transmittance of the liquid crystal layer is changed to display the image.

The display panel 590 may further include a driving portion 593 and a panel printed circuit film 594. The driving portion 593 is mounted on the first substrate 591 and provides a panel driving-signal to the display panel 590. One edge of the panel printed circuit film 594 is electrically connected with the first substrate 591 and receives an image signal from outside.

Figure 9:
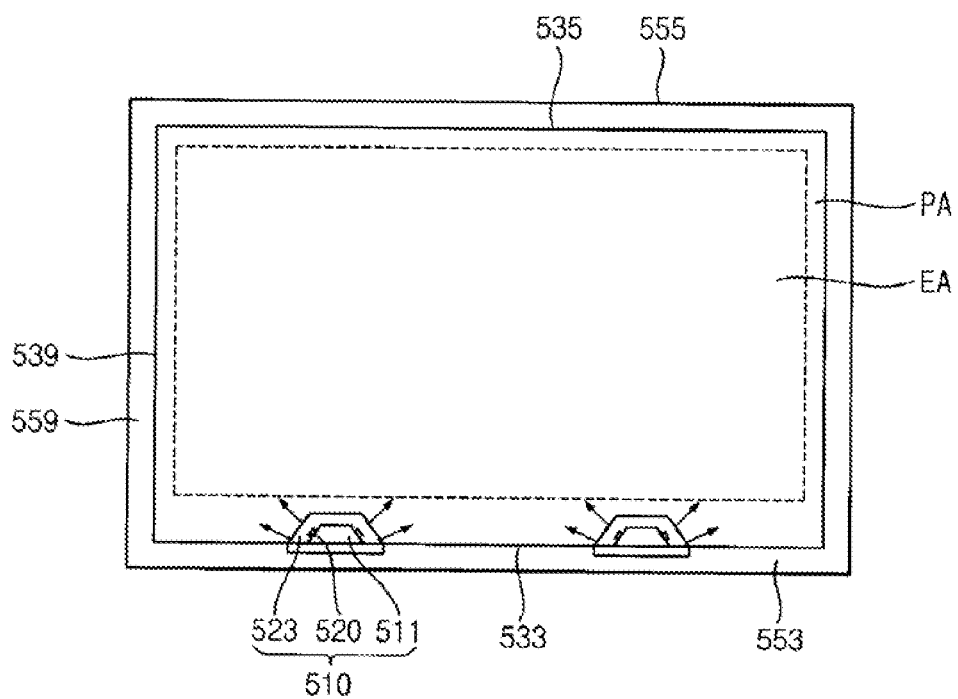
FIG. 9 is a plan view illustrating the display device in FIG. 7.
Figure 10:
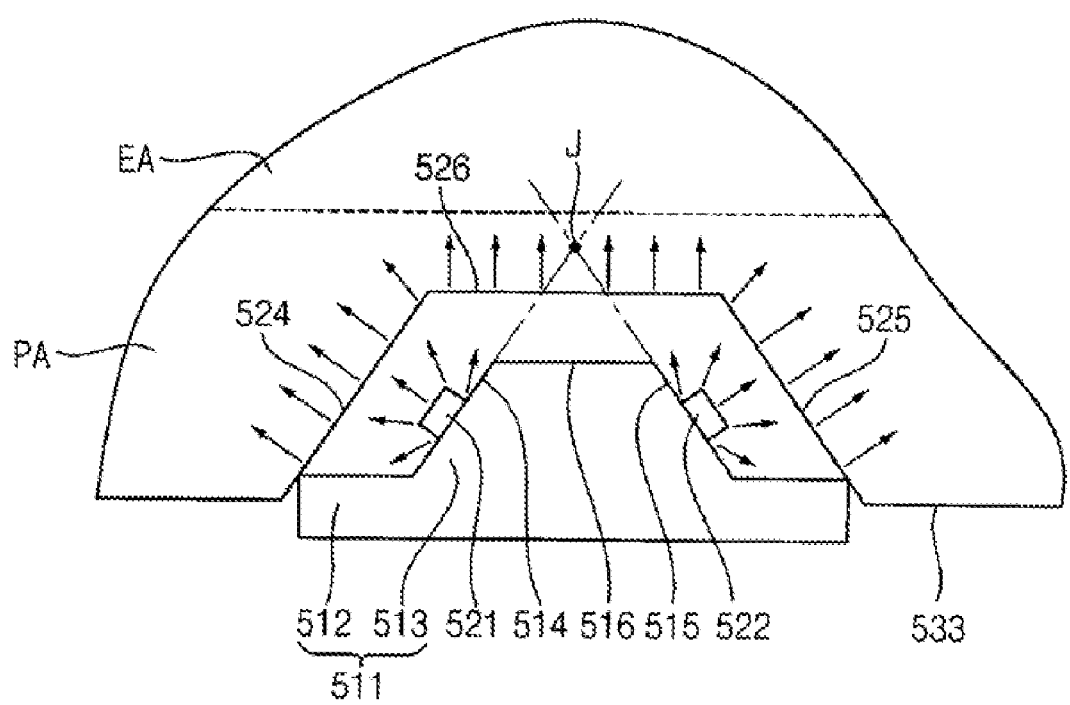
FIG. 10 is an enlarged view illustrating the point light source in FIG. 9.

FIG. 9 is a plan view illustrating the display device in FIG. 7, and FIG. 10 is an enlarged view illustrating the point light source in FIG. 9. For example, FIG. 9 is a view illustrating the light-guiding unit 530 received in the receiving container 500 and the point light source 510.

Referring to FIGS. 7, 9 and 10, in order to reduce luminance difference between a bright-portion and a dark-portion at an effective emitting area EA, the display device 500 is designed such that the point light source 510 is disposed at a peripheral area PA or an outer portion of the effective emitting area EA of the light-guiding unit 530. Also, the display device 500 is designed such that a body 511 of the point light source 510 uniformly emits light emitted from the point light source 510.

For example, the body 511 includes a bottom portion 512 and a protrusion portion 513. The protrusion portion 513 includes a first inclined-surface 514, a second inclined-surface 515 and an upper surface 516. The first and second inclined-surfaces 514 and 515 respectively guide a light, which is emitted from a fluorescent unit 523, toward an extending-direction of the first inclined-surface 514 and toward an extending-direction of the second inclined-surface 515. Therefore, an area surrounded by the first extended-surface, the second extended-surface and the upper surface 516 may become the dark-portion, has a lower-luminance than a peripheral area thereof. Thus, a peripheral area of the dark-portion may become the bright-portion.

In order to reduce luminance difference between the dark-portion and the bright-portion generated at the effective emitting area EA, the first and second extended-surfaces may preferably cross each other at the outer portion of the effective emitting area EA. Then, an inclined-angle that the first and second inclined-surfaces 514 and 515 that are slanted with respect to the surface of the bottom portion 512 may be appropriately selected at a desired angle.

According to an embodiment of the present invention, the point light source has an emitting-angle of about 180 degrees. Therefore, luminance difference between a bright-portion and a dark-portion at the light-emitting surface of the light-emitting module and the display screen of the display device is reduced. As a result, the display quality of the display device is improved.

Embodiments of the invention have been described with reference to the example embodiments. It is evident, however, that many alternative modifications and variations will be apparent to those having skill in the art in light of the foregoing description. Accordingly, embodiments of the present invention embrace all such alternative modifications and variations as fall within the spirit and scope of the appended claims.

What is claimed is:

1. A point light source comprising:
   a body including a bottom portion and a protrusion portion protruded from the bottom portion;
   a light-emitting unit including a light-emitting chip disposed at the protrusion portion to be inclined with respect to the bottom portion by an inclined-angle; and
   a fluorescent unit covering the bottom portion, the protrusion portion and the light-emitting chip,
   wherein the protrusion portion comprises:
   a first inclined-surface being inclined with respect to a surface of the bottom portion by a first angle;
   a second inclined-surface, the first and second inclined-surfaces being substantially symmetric with respect to a perpendicular surface to the surface of the bottom portion; and
   an upper surface having a length and a width connecting a top portion of the first inclined-surface to a top portion of the second inclined-surface.

2. The point light source of claim 1, wherein the light-emitting unit comprises:
   a first light-emitting chip disposed at the first inclined-surface; and
   a second light-emitting chip disposed at the second inclined-surface.

3. The point light source of claim 1, wherein a surface of the fluorescent unit comprises:
   a first surface corresponding to the first inclined-surface;
   a second surface corresponding to the second inclined-surface; and
   a third surface corresponding to the upper surface.

4. The point light source of claim 2, wherein the first light-emitting chip and the second light-emitting chip emit a blue-colored light, and the fluorescent unit comprises a yellow fluorescent unit receiving the blue-colored light and emitting a white-colored light.

5. The point light source of claim 1, wherein the first angle has a range of about 30 degrees to about 45 degrees.

6. The point light source of claim 1, further comprising:
a light-guiding unit including a light-emitting surface and a groove, wherein said point light source is disposed at said groove; and
a power supply substrate, on which the point light source is mounted, and providing a driving current to the light-emitting unit.

7. The point light source of claim 6, further comprising a display panel displaying an image by using a light emitted from the light-emitting surface.

8. A point light source comprising:
a body including a bottom portion and a protrusion portion protruded from the bottom portion;
a light-emitting unit including a light-emitting chip disposed at the protrusion portion to be inclined with respect to the bottom portion by an inclined-angle; and
a fluorescent unit covering the bottom portion, the protrusion portion and the light-emitting chip,
wherein a surface of the protrusion portion comprises a round curved-surface.

9. The point light source of claim 8, wherein the surface of the light-emitting unit corresponds to the surface of the protrusion portion and comprises the round curved-surface.

10. A light-emitting module comprising:
a light-guiding unit including a groove;
a point light source disposed at the groove that includes a light-emitting chip emitting a first light, and a fluorescent unit receiving the first light and emitting a second light to the light-guiding unit; and
a power supply substrate, on which the point light source is mounted, and providing a driving current to the light-emitting chip.

11. The light-emitting module of claim 10, wherein the point light source includes a body including a bottom portion and a protrusion portion protruded from the bottom portion toward the groove;
a light-emitting unit including said light-emitting chip disposed at the protrusion portion to be inclined with respect to the bottom portion by an inclined-angle; and
wherein said fluorescent unit covers the bottom portion, the protrusion portion and the light-emitting chip.

12. The light-emitting module of claim 10, wherein the light-guiding unit comprises:
a light-emitting surface emitting the second light;
an opposite surface disposed opposite to the light-emitting surface; and
a side surface connecting the light-emitting surface to the opposite surface and including the groove.

13. The point light source of claim 12, further comprising a display panel displaying an image by using a light emitted from the light-emitting surface.

14. The light-emitting module of claim 12, wherein a plurality of grooves is formed at the side surface and a plurality of point light sources are disposed at the grooves, respectively.

15. The light-emitting module of claim 10, wherein the protrusion portion comprises:
a first inclined-surface, on which a first light-emitting unit is mounted, and being inclined with respect to a surface of the bottom portion by a first angle; and
a second inclined-surface, on which a second light-emitting unit is mounted and having symmetry with the first inclined-surface with respect to a perpendicular surface to the surface of the bottom portion.

16. The light-emitting module of claim 15, wherein the groove comprises:
a first inner side surface corresponding to the first inclined-surface; and
a second inner side surface corresponding to the second inclined-surface.

17. A display device comprising:
a point light source including:
a body including a bottom surface, a first inclined-surface and a second inclined surface inclined with respect to the bottom surface by a first and a second angle, respectively, the first and second inclined-surfaces being substantially symmetric with respect to a perpendicular surface to the bottom surface;
a light-emitting unit including a first light-emitting chip disposed at the first inclined-surface and a second light-emitting chip disposed at the second inclined-surface; and
a fluorescent unit covering the bottom surface, the first inclined surface, the second inclined-surface, the first light-emitting chip and the second light-emitting chip;
a power supply substrate, on which the point light source is mounted, the power supply substrate providing a driving current to the first and second light-emitting chips;
a light-guiding unit including a light-emitting surface, an opposite surface disposed opposite to the light-emitting surface and a side surface including a groove in which the point light source is disposed, wherein a shape of the groove corresponds to a shape of the fluorescent unit of the point light source; and
a display panel displaying an image by using a light emitted from the light-emitting surface.

18. The display device of claim 17, wherein the light-emitting surface comprises an effective emitting area corresponding to an effective display area of the display panel,
a first extended-surface extended from the first inclined-surface and a second extended-surface extended from the second inclined-surface, the first and second extended-surfaces crossing with each other at an outer portion of the effective emitting area.

* * * * *